United States Patent
Hogan et al.

[11] Patent Number: 5,441,797
[45] Date of Patent: Aug. 15, 1995

[54] ANTIREFLECTIVE POLYIMIDE DIELECTRIC FOR PHOTOLITHOGRAPHY

[75] Inventors: Dennis P. Hogan, Jericho; Harold G. Linde, Richmond; Ronald A. Warren, Essex Juntion, all of Vt.

[73] Assignee: International Business Machines Corporation, Armonk, N.Y.

[21] Appl. No.: 315,801

[22] Filed: Sep. 30, 1994

Related U.S. Application Data

[62] Division of Ser. No. 54,500, Apr. 27, 1993, Pat. No. 5,397,684.

[51] Int. Cl.⁶ .............................................. B32B 9/00
[52] U.S. Cl. ................................. 428/209; 428/461; 428/473.5; 430/909; 430/313; 430/270
[58] Field of Search ................ 428/195, 209, 210, 457, 428/461, 473.5; 430/283, 287, 909, 281, 313, 270, 338, 904, 311, 322, 56; 427/306

[56] References Cited

U.S. PATENT DOCUMENTS

| | | | |
|---|---|---|---|
| 4,126,466 | 11/1978 | Roos | 96/84 |
| 4,189,735 | 2/1980 | Bell et al. | 346/135.1 |
| 4,248,957 | 2/1981 | Sander | 430/283 |
| 4,268,601 | 5/1981 | Namiki et al. | 430/159 |
| 4,307,172 | 12/1981 | Ishihara et al. | 430/160 |
| 4,465,767 | 8/1984 | Oba et al. | 430/271 |
| 4,480,009 | 10/1984 | Berger | 428/447 |
| 4,668,606 | 5/1987 | DoMinh et al. | 430/271 |
| 4,745,044 | 5/1988 | Gregor | 430/312 |
| 4,766,055 | 8/1988 | Kawabata | 430/283 |
| 4,910,122 | 3/1990 | Arnold et al. | 430/313 |
| 5,028,503 | 7/1991 | Chang | 430/283 |
| 5,326,669 | 7/1994 | Curtis | 430/283 |
| 5,331,182 | 7/1994 | Takimoto | 313/504 |

*Primary Examiner*—Patrick J. Ryan
*Assistant Examiner*—Patrick Jewik
*Attorney, Agent, or Firm*—Heslin & Rothenberg

[57] ABSTRACT

A process is disclosed for making circuit elements by photolithography comprising depositing an antireflective polyimide or polyimide precursor layer on a substrate and heating the substrate at 200° C. to 500° C. to provide a functional integrated circuit element that includes an antireflective polyimide layer. The antireflective polyimide layer contains a sufficient concentration of at least one chromophore to give rise to an absorbance sufficient to attenuate actinic radiation at 405 or 436 nm. Preferred chromophores include those arising from perylenes, naphthalenes and anthraquinones. The chromophore may reside in a dye which is a component of the polyimide coating mixture or it may reside in a residue which is incorporated into the polyimide itself.

10 Claims, 1 Drawing Sheet fig. 1 fig. 2
PRIOR ART fig. 3
PRIOR ART fig. 4

ANTIREFLECTIVE POLYIMIDE DIELECTRIC FOR PHOTOLITHOGRAPHY

This application is a division of application Ser. No. 08/054,500, filed Apr. 27, 1993, now U.S. Pat. No. 5,397,684.

FIELD OF THE INVENTION

The invention relates to antireflective polyimide layers used in photolithography to fabricate semiconductor devices.

BACKGROUND OF THE INVENTION

Photolithography using ultraviolet light is a fundamental technology in the production of semiconductor devices. In the integrated circuit (IC) lithographic process, a photosensitive polymer film is applied to the silicon wafer, dried, and then exposed with the proper geometrical patterns through a photomask to ultraviolet (UV) light or other radiation. After exposure, the wafer is soaked in a solution that develops the images in the photosensitive material. Depending on the type of polymer used, either exposed or nonexposed areas of film are removed in the developing process. The majority of Very Large Scale Integration (VLSI) exposure tools used in IC production are optical systems that use UV light. They are capable of approximately 1 $\mu$m resolution, $\pm 0.5$ $\mu$m ($3\sigma$) registration, and up to 100 exposures per hour; they are commonly operated at 405 nm (so-called H-line) or 436 nm (so-called G-line).

A frequent problem encountered by resists used to process semiconductor devices, is reflectivity back into the resist of the activating radiation by the substrate, especially those containing highly reflecting topographies. Such reflectivity tends to cause standing wave ripples and reflective notches, which interfere with the desired pattern in the photoresist. The notches are particularly bad when the support or metallurgy is non-planar.

Figure 1:
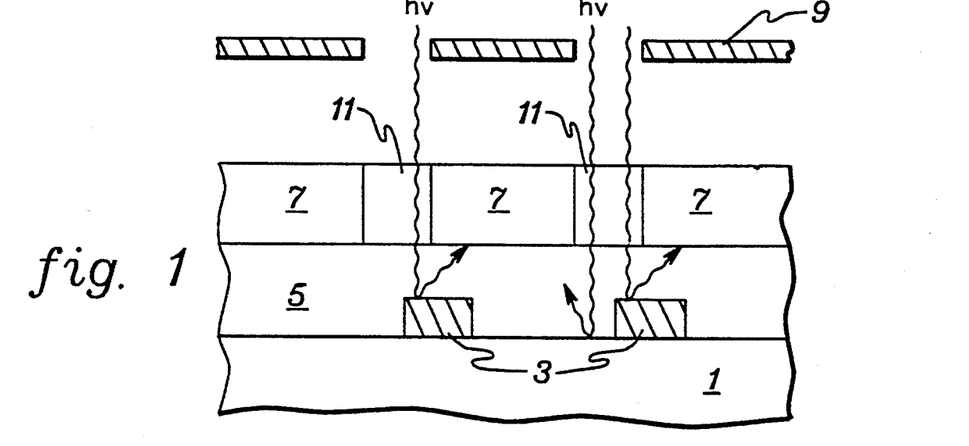
FIGS. 1 to 3 are schematic cross-sections of devices of the art.

The problem is illustrated in FIG. 1, which depicts a substrate 1 on which has been formed a metal pattern 3. The metal has been covered with a polyimide dielectric 5 and the polyimide layer planarized. A resist 7 has been deposited and is being exposed through a mask 9. Incident radiation passes through the apertures in the mask and, in an ideal situation, exposes only those areas 11 directly in line with the apertures. Unfortunately when the metal pattern 3 is highly reflective, as it usually is, the reflected light from the metal and, to a lesser extent, from the substrate impinges on areas of the resist not intended to be exposed.

Figure 2:
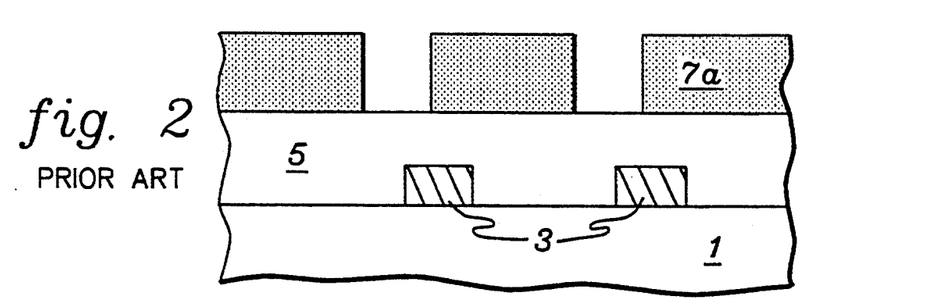
Figure 3:
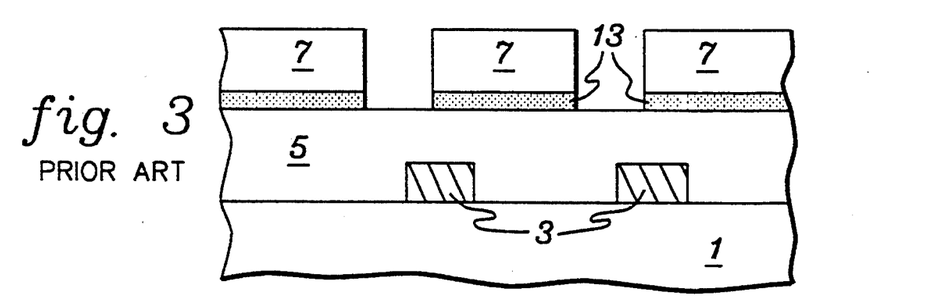

The art discloses two basic approaches to the problem: (1) change the wavelength of the radiation and (2) incorporate some sort of radiation absorber into or under the photoresist. The first approach is awkward and expensive because it requires a new tool set. The second approach and its addendant drawbacks are illustrated in FIGS. 2 and 3. In FIG. 2 a dye containing a chromophore that absorbs at the appropriate wavelength is incorporated in the resist layer; this cuts down on reflected radiation but also on resist sensitivity. In FIG. 3 a dye containing a chromophore of appropriate absorption is incorporated a special layer 13 beneath the resist 7; this adds to the process additional steps for the deposition and removal of the layer.

Figure 4:
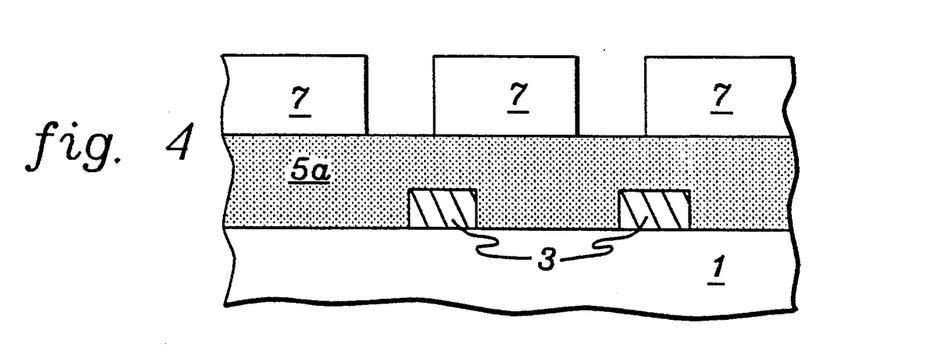
FIG. 4 is a schematic cross-section of a device according to the invention.

A superior process could be envisioned if it were possible to incorporate a dye into the polyimide layer itself (FIG. 4). While this is a fine idea in theory, in practice it is not straightforward. Since the polyimide will remain as part of the semiconductor device, the modified polyimide layer must be deposited as a normal polyimide layer would be, and then it must survive subsequent curing, planarization and metal deposition cycles in which the temperature exceeds 400° C. Typical UV-absorbing dyes such as curcumin and bixin, when incorporated into polyimide films give rise to dielectric films that are not stable above 300° C. Typical pigments that might be thermostable are insoluble and give rise to problems of homogeneity. Thus there is a need for an antireflective polyimide layer that processes normally and that is extremely thermally stable.

SUMMARY OF THE INVENTION

It is an object of the present invention to provide an antireflective dielectric layer that will survive high temperature processing.

It is a further object to provide a polyimide composition that absorbs radiation in the 400 to 450 nm range and that is stable above 400° C.

It is a further object to provide a photolithography process that substantially eliminates problems of reflectivity without adding any processing steps.

These and other objects, features and advantages are realized in the present invention which relates generally to a process of making a semiconductor structure in which a polyimide is used as an interlevel dielectric. According to the process, a chromophore is introduced into the polyimide film. During subsequent patterning steps, the modified polyimide film absorbs radiation so that it does not reflect and expose the resist in undesired areas. A suitable chromophore must absorb radiation in the 400–450 nm region. Its host molecule must be thermally stable at temperatures greater than 400° C. and soluble as part of the mixture with the polyimide precursor (polyamic acid or polyamic ester) material.

In one aspect, the invention relates to a process for making circuit elements by photolithography comprising:

(a) depositing an antireflective layer on a substrate. The antireflective polyimide layer comprises a polyimide, polyamic acid, polyamic ester or combination thereof and contains a sufficient concentration of at least one chromophore to give rise to an absorbance sufficient to attenuate radiation at 405 or 436 nm; and (b) heating the antireflective layer at 200° C. to 500° C. to provide a functional circuit element that includes the antireflective polyimide layer.

As a practical matter, the process will usually include the intermediate or subsequent steps normally attendant to photolithographic processes, namely depositing a photoresist over the polyimide layer, imaging the photoresist with actinic radiation, preferably at 405 or 436 nm, developing the photoresist, using it to pattern a layer beneath the resist and removing the resist. Alternately, the photoresist can be deposited over the uncured antireflective layer, and when the layer comprises a polyamic acid, it can be developed along with the photoresist. The polyimide is then cured after removing the photoresist.

Preferred chromophores, which may occur either in a dye that is a component of the polyimide layer or in a recurring unit in a polyimide polymer, include those chromophores arising from naphthalenes, anthraquinones or perylenes.

In another aspect the invention relates to a thermostable polyimide film comprising a polyimide and a thermostable dye. The dye has a molar extinction coefficient (ε) greater than 5000 between 400 and 450 nm and a solubility of at least 2 g/L in an inert, organic solvent. A preferred solvent is N-methylpyrrolidone (NMP). After cyclization, the film exhibits less than 1%, and preferably less than 0.5%, decrease in weight when heated at 450° for 20 minutes. One group of suitable dyes includes precursor amic acids which form materials such as perylene red. The cyclized materials are members of the genus of formula I

The precursors are of formula V wherein $R^1$ and $R^2$ are independently chosen from the group consisting of phenyl; phenyl substituted with one or more lower-alkyl, lower-alkoxy, halogen or nitro; naphthyl and naphthyl substituted with one or more lower-alkyl, lower-alkoxy, halogen or nitro and $R^{10}$ is hydrogen or alkyl of one to four carbons.

Other suitable dyes, such as precursors VIII to indanthrene brilliant orange, give rise to members of the genus of formula II wherein $Ar^5$ and $Ar^6$ are independently chosen from the group consisting of phenyl, anthraquinone, phenyl substituted with lower-alkyl, lower-alkoxy, halogen or nitro; naphthyl; and naphthyl substituted with lower-alkyl, lower-alkoxy, halogen or nitro. Still other dyes are members of the genus of formula III and their precursors XII wherein $Ar^7$ is selected from the group consisting of phenyl; naphthyl; phenyl substituted with one or more lower-alkyl, lower-alkoxy, halogen or nitro; and $Ar^8$ is an anthraquinone residue.

The invention also relates to semiconductor devices comprising at least one functional IC and a polyimide film as described above.

In another aspect the invention relates to a polyimide comprising repeating units of formula IV wherein
$Ar^1$ is selected from the group consisting of and

Ar² is selected from the group consisting of

Ar³ is selected from the group consisting of residues encompassed by Ar¹ plus

Ar⁴ is selected from the group consisting of residues encompassed by Ar² plus m is from zero to 100; and
n is from 1 to 100;
with the proviso that at least one of Ar³ and Ar⁴ must be other than a substituent chosen from the groups Ar¹ and Ar².

Preferred polyimides include those in which m is 90 to 99 and n is 1 to 10, those in which Ar³ is and Ar⁴ is Ar², and those in which Ar³ is Ar¹ and Ar⁴ is In another aspect, the invention relates to blended polyimides comprising a first component, which is a conventional polyimide comprised of the groups Ar¹ and Ar², and a second component which is a polymide of formula IV.

In another aspect the invention relates to semiconductor devices comprising at least one functional IC and a polyimide film as described above.

DETAILED DESCRIPTION OF THE INVENTION

Four criteria must be met in providing an antireflective polyimide layer that will remain a part of a functional IC device: (1) the layer must function normally as a dielectric, (2) the layer must behave like a normal polyimide in fabrication processes, (3) the layer must be stable above 400° C., and the layer must have a sufficient absorbance to provide a practical barrier to reflected radiation. In accordance with the invention, there are provided two approaches to such a layer: (1) incorporate a dye meeting the foregoing criteria into a conventional polyimide precursor solution or (2) incorporate a chromophore into the polyimide polymer itself without impairing the mechanical and electrical properties of the cured polymer.

Dyes that have been found suitable for incorporation into the precursor mix include soluble amic acid precursors to perylene red (Formula I; R¹ = R² =  )

and indanthrene brilliant orange (formula II; Ar⁵=Ar⁶=phenyl). The dyes are not usually incorporated into the spin-coating mix in their imide (cyclized) forms, but rather, like the polyimide itself, are incorporated in the formulation as their amic acid or ester precursors and are then cyclized in situ when the polyamic acid or ester is cured. In addition, condensation products of perylenetetracarboxylic acid with aromatic amines and condensation products of anthraquinone diamines with aryl orthodicarboxylates have been found to possess suitable chromophores while exhibiting compatible solubility in normal casting solvents such as N-methylpyrrolidone (NMP). Moreover the films formed from these dyes in combination with conventional polyamic acids and esters are surprisingly often more thermally stable than the corresponding unmodified polyimide layers. The absorbance through a one micron layer will normally be at least 0.05 and preferably greater than 0.3 at 405 or 436 nm. This is sufficient to usefully attenuate most radiation that would give rise to a reflection problem.

The dyes may be made by reacting perylene dianhydride (PDA) with two moles of the appropriate monoamine to form the amic acid V, which, when heated, cyclizes to the imide, as shown in Scheme A:

A mixture of amines can be used to make peryleneimides having differing R groups.

Indanthrene-type (fused benzimidazole) dyes of formula II may be synthesized analogously from a cyclic dianhydride and two moles of an orthodiamine VII, as shown in scheme B:

As before, a mixture of amines will produce compounds of formula II having differing Ar groups.

Two examples are fused imidazoles IX and X, made from PMDA and diaminonapthalene or diaminoanthraquinone:

IX

VI +

↓

X

The dyes of genus III may be prepared similarly from two moles of a cyclic monoanhydride and one mole of a non-ortho diamine: (Orthodiamines tend to cyclize to fused benzimidazoles as above.)

Scheme C

XI

↓

-continued
Scheme C

XII

III for example:

-continued bly as a result of analogous structures, their precursors have compatible solubility to that of polyamic acids and esters for spin coating the resins, and the chromophores can be modulated by appropriate substitution to achieve the necessary absorbance between 400 and 450 nm.

From consideration of Schemes A, B and C, particularly B, one can envision that by using a UV-absorbing dianyhydride or diamine one could make polyamic acids, similar to VIII, which could then be inserted into conventional polyamic acid precursors for polyimide films:

In all of the foregoing Schemes, the initial reaction is carried out to produce the amic acid (e.g. V, VIII, XII) which is coated on the substrate in solution and then cured to the final product after depositon. The important features of all three classes of dyes are that, probably as a result of analogous structures, their precursors have compatible solubility to that of polyamic acids and esters for spin coating the resins, and the chromophores can be modulated by appropriate substitution to achieve the necessary absorbance between 400 and 450 nm.

This may be accomplished by mixing the anhydrides and diamines in the proper stoichiometry for the desired absorbance and physical properties. We have found that about 1 to 10% of one component having the UV-absorbing chromophore produces useful polyamic acids for the production of polyimide films of 0.5 to 5 μm thickness. If thinner films are desired, the proportion of absorbing precursor can be increased. The actual amount to be used will depend on the extinction coefficient of the particular chromophore and the amount of absorbance needed for a particular application.

An example of a film according to Scheme D wherein the stoichiometry includes no component XVI is shown below:

Similar polyamic acids can be made using a UV-absorbing diamine, such as 1,5-diaminoanthraquinone as the XVI component in place of or in addition to XVa. However, adjustments in stoichiometry of the components must be made to account for the low reactivities of aromatic diamines with XVa.

Alternatively, one can make UV-absorbing polyamic acids and make physical mixtures with conventional polyamic acids or esters. Conventional polyamic acids and their constituent diamine/dianhydride components are described, for example, in U.S. Pat. No. 4,480,009 (column 18 to 22) the disclosure of which is incorporated herein by reference. These mixtures can then be cured to make blended polyimides rather than copolymers, i.e. physical mixtures rather than covalent compounds.

The polyamic esters may be prepared by methods well-known in the art, for example by reacting the anhydride with an alcohol followed by thionyl chloride and then the diamine. The esters have certain advantages when it is desired to heat the polyamic ester precursor (for example to drive off solvent) without having it cyclize to a polyimide. The ester can then be cyclized to the polyimide by raising the temperature.

EXAMPLE 1

(Formula II: $Ar^5=Ar^6=$naphthalene)

To a solution of 15.82 g (100 mmol) of 2,3-diamino naphthalene in 100 mL of NMP was added 3.4 g (50 mmol) of 1,4,5,8-naphthalenetetracarboxylic dianhydride (NDA), and the formulation was mixed on a roller mill for 16 hours to form the 2:1 amic adduct. Ten grams of this solution was added to 75 g of a 16% solution of polyamic ethyl ester (PAETE). The NMP solution was spin coated on a quartz substrate to a thickness of 2 μm and heated at 350° C. for 20 min. The resulting film exhibited absorbance of 0.68 at 405 nm and 0.35 at 436 nm; thermogravimetric analysis (TGA) indicated a weight loss of 0.18% when heated from 350° to 450° over a period of 100 minutes.

EXAMPLE 2

(Formula II: $Ar^5=Ar^6=$anthraquinone)

The procedure of example 1 was followed using 1,2-diaminoanthraquinone in place of 2,3-diaminonaphthalene. The resulting film exhibited absorbance of 0.90 at 405 nm and 0.45 at 436 nm; thermograviometric analysis showed a weight loss of 0.12% on heating from 350° to 450° over 100 minutes.

EXAMPLE 3

(Formula IV: $Ar^1=$phenyl, $Ar^2=$xylyl, $A^3=$perylene, $Ar^4=$xylyl, m=99 and n=1)

3,4,9,10-Perylenetetracarboxylic dianhydride (0.625 g) (1.59 mmol) (PDA) was reacted with 10g (73.42 mmol) of m-xylylenediamine by combining reagents and mixing the reactants on a roller mill. After 18 hours 150 mL of NMP and 15.667 g (71.93 mmol) of pyromellitic dianhydride (PMDA) were added to the mixture and the reactants mixed again for 24 hours. This copolymer produced good amic acid films that imidized to a red polyimide according to the procedure described in example 1. The polyimide film exhibited absorbance of 0.11 at 405 nm and 0.13 at 436 nm; TGA showed a weight loss of 0.15% under the usual program.

EXAMPLES 4-7

(Formula IV: $Ar^3$phenyl, $Ar^4=$anthraquinone, m=0) plus PAETE

As examples of copolymer blends (physical mixtures of polyimides), four diaminoanthraquinones were individually reacted with one equivalent of PMDA at 0.5 mmol/mL in NMP to produce amic acid solutions of 18.5% solids. The solutions were mixed 1:9 with PAETE, spin coated and heated at 350° C. to give copolymer blends suitable for device coating.

| Example | Amino Substitution | post 350° C. $\lambda_{max}$ |
|---------|-------------------|------------------------------|
| 4 | 1,2 | 406 |
| 5 | 1,4 | 400,480 |
| 6 | 2,6 | 350,490 |
| 7 | 1,5 | 432 |

1,5-Diaminoanthraquinone (Example 7) gave rise to films with absorption maxima at 432; these are particularly advantageous for mercury G-line photolithography.

EXAMPLE 8

(Formula IV: $Ar^1=$phenyl, $Ar^2=Ar^4=$xylyl, $Ar^3=$perylene, m=98, n=2)

A copolymer was prepared by adding excess m-diaminoxylene to perylenedianhydride. The resulting 2:1 amine/anhydride adduct formed as a dark precipitate which was dissolved and incorporated as a block along a polyamic acid copolymer chain with PMDA as the major anhydride link. A stoichiometry of 2.1% perylene gave the resulting copolymer significant red color in the imidized film. This copolymer provides good film quality, but the UV absorption maxima are at 496 and 533 with only a shoulder at 464.

While the invention has been particularly shown and described with reference to preferred embodiments thereof, it will be understood by those skilled in the art that other changes in form and details may be made therein without departing from the spirit and scope of the invention.

We claim:

1. A thermostable polyimide film comprising a polyimide and a thermostable dye, said dye having a molar extinction coefficient ($\epsilon$) greater than 5000 between 400 and 450 nm and a solubility of at least 2 g/L in an inert organic solvent, said film exhibiting less than 1% decrease in weight when heated at 450° for 20 minutes.

2. The film of claim 1 wherein said dye is chosen from the genus of formula and its precursor amic acids and esters wherein $R^1$ and $R^2$ are independently chosen from the group consisting of phenyl; phenyl substituted with one or more lower-alkyl, lower-alkoxy, halogen or nitro; naphthyl; and naphthyl substituted with one or more lower-alkyl, lower-alkoxy, halogen or nitro and $R^{10}$ is hydrogen or alkyl of one to four carbons.

3. The film of claim 2 wherein $R^1$ and $R^2$ are both

4. The film of claim 1 wherein said dye is chosen from the genus of formula and its precursor amic acids and esters wherein $Ar^5$ and $Ar^6$ are independently chosen from the group consisting of phenyl; anthraquinone; phenyl substituted with lower-alkyl, lower-alkoxy, halogen or nitro; naphthyl; and naphthyl substituted with lower-alkyl, lower-alkoxy, halogen or nitro and $R^{10}$ is hydrogen or alkyl of one to four carbons.

5. The film of claim 4 wherein $Ar^5$ and $Ar^6$ are both

6. The film of claim 4 wherein $Ar^5$ and $Ar^6$ are both 3,4-naphthalene.

7. The film of claim 4 wherein $Ar^5$ and $Ar^6$ are both 1,2-substituted anthraquinone.

8. The film of claim 1 wherein said dye is chosen from the genus of formula and its precursor $$HOOC-Ar^7-\underset{\underset{O}{\|}}{C}NH-Ar^8-NH\underset{\underset{O}{\|}}{C}-Ar^7-COOH$$

wherein $Ar^7$ is selected from the group consisting of phenyl, naphthyl; phenyl substituted with one or more lower-alkyl, lower-alkoxy, halogen or nitro; and $Ar^8$ is an anthraquinone residue.

9. The film of claim 8 wherein $Ar^7$ is and $Ar^8$ is 1,5-substituted anthraquinone.

10. A semiconductor device comprising:
(a) a semiconductor substrate having at least one functional integrated circuit; and
(b) a polyimide film according to claim 1.

* * * * *

UNITED STATES PATENT AND TRADEMARK OFFICE
CERTIFICATE OF CORRECTION

PATENT NO. : 5,441,797         Page 1 of 3
DATED     : Aug. 15, 1995
INVENTOR(S) : Hogan et al.

It is certified that error appears in the above-indentified patent and that said Letters Patent is hereby corrected as shown below:

Column 4, line 15, delete the following structure:

and insert therefor

UNITED STATES PATENT AND TRADEMARK OFFICE
CERTIFICATE OF CORRECTION

PATENT NO. : 5,441,797            Page 2 of 3
DATED : Aug. 15, 1995
INVENTOR(S) : Hogan et al.

It is certified that error appears in the above-indentified patent and that said Letters Patent is hereby corrected as shown below:

Column 12, Scheme D, delete the following structure:

IV and insert therefor

UNITED STATES PATENT AND TRADEMARK OFFICE
CERTIFICATE OF CORRECTION

PATENT NO. : 5,441,797
DATED : Aug. 15, 1995
INVENTOR(S) : Hogan et al.

Page 3 of 3

It is certified that error appears in the above-indentified patent and that said Letters Patent is hereby corrected as shown below:

IV

Signed and Sealed this

Fifth Day of March, 1996

Attest:

BRUCE LEHMAN

Attesting Officer

Commissioner of Patents and Trademarks